(12) United States Patent
Qu et al.

(10) Patent No.: US 10,965,280 B2
(45) Date of Patent: Mar. 30, 2021

(54) DELAY CIRCUIT, CLOCK CONTROL CIRCUIT AND CONTROL METHOD

(71) Applicant: MONTAGE TECHNOLOGY CO., LTD., Shanghai (CN)

(72) Inventors: Bo Qu, Shanghai (CN); Jinfu Chen, Shanghai (CN); Lixin Jiang, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 16/730,458

(22) Filed: Dec. 30, 2019

(65) Prior Publication Data

US 2020/0304115 A1 Sep. 24, 2020

(30) Foreign Application Priority Data

Mar. 18, 2019 (CN) .......................... 201910205015.4

(51) Int. Cl.
*H03K 5/13* (2014.01)
*H03K 5/135* (2006.01)
*G06F 1/10* (2006.01)
*H03K 5/133* (2014.01)

(52) U.S. Cl.
CPC ............... *H03K 5/135* (2013.01); *G06F 1/10* (2013.01); *H03K 5/133* (2013.01)

(58) Field of Classification Search
CPC ........... H03K 5/135; H03K 5/133; G06F 1/10
USPC ........................................................ 327/291
See application file for complete search history.

(56) References Cited

U.S. PATENT DOCUMENTS

| | | | | |
|---|---|---|---|---|
| 7,456,665 B2* | 11/2008 | Hinz | ...................... | H03K 5/135 327/158 |
| 7,932,766 B2* | 4/2011 | Choi | ..................... | H03L 7/0998 327/276 |
| 8,115,532 B2* | 2/2012 | Zhang | .................. | H03H 11/265 327/261 |
| 8,786,340 B1* | 7/2014 | Yong | ..................... | H03L 7/0814 327/158 |
| 9,490,785 B1* | 11/2016 | Sridhar | ................ | H03K 3/0315 |
| 9,859,880 B2* | 1/2018 | Chae | ........................ | H03K 19/20 |
| 9,864,720 B2* | 1/2018 | Chae | ........................ | G06F 13/4243 |
| 9,899,993 B2* | 2/2018 | Onodera | ................ | H03K 5/134 |
| 2007/0069791 A1* | 3/2007 | Chae | ........................ | H03K 5/133 327/261 |
| 2012/0086485 A1* | 4/2012 | Trivedi | ................ | H03H 11/265 327/158 |
| 2014/0125381 A1* | 5/2014 | Schreiber | ................. | H05K 3/00 326/93 |

(Continued)

*Primary Examiner* — Ryan Jager
(74) *Attorney, Agent, or Firm* — Oliff PLC

(57) ABSTRACT

A delay circuit, a clock control circuit and a control method are disclosed. The delay circuit includes N-stage delay units coupled in a chain, the delay unit of each stage comprises the four-state gate circuit and an inverter circuit, an input terminal of a four-state gate circuit and an input terminal of an inverter circuit of each stage are coupled together, another input terminal of the inverter circuit is coupled to an output terminal of the inverter circuit of the next stage; an input signal is coupled to the input terminal of the four-state gate circuit and the inverter circuit of the first stage, and is output with a certain delay of time by sequentially passing through the four-state gate circuit and the inverter circuit of each stage.

12 Claims, 4 Drawing Sheets

(56) References Cited

U.S. PATENT DOCUMENTS

2016/0149564 A1 5/2016 Huang et al.
2018/0316337 A1 11/2018 Tsai et al.

\* cited by examiner

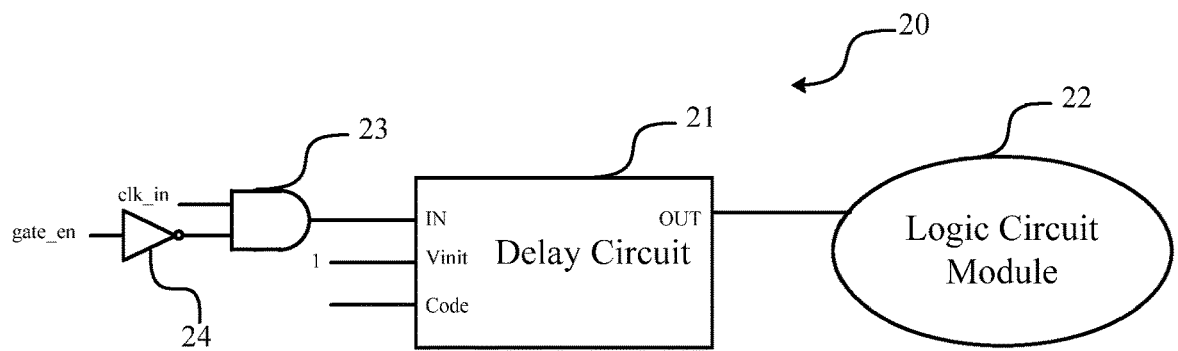

Figure 5

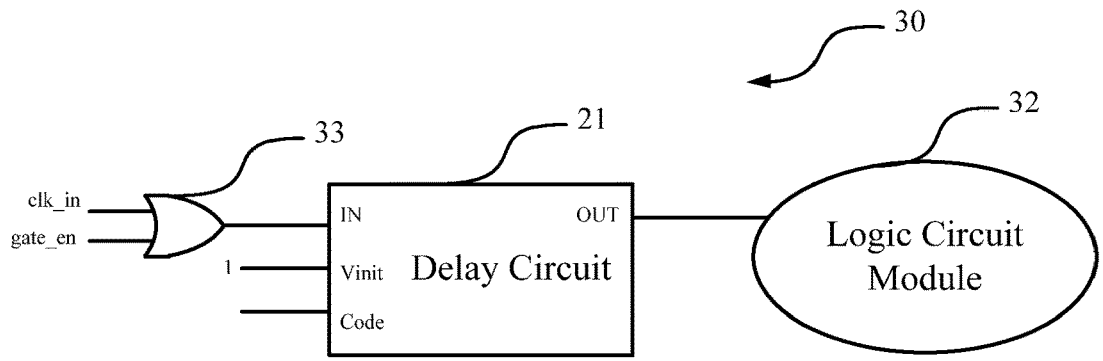

Figure 6

| Controlling, in the 0th to M-1th stages, inverter units to be turned on, pull-up units and pull-down units to be turned off, and in the Mth-stage, an inverter unit to be turned off, pull-up unit and pull-down unit to be turned off | S110 |
|---|---|

↓

| Controlling, in the 0th to M-1th stages, first inverters to be turned off and second invertesrs to be turned on, and in the Mth stage, a first inverter to be on and a second inverter to be off | S120 |
|---|---|

↓

| Outputting, the clock signal with a certain delay of time by sequentially passing through the inverter units of the 0th to M-1th stages, the first inverter of the Mth stage and the second inverters of the M-1th to 0th stages | S130 |
|---|---|

Figure 7

DELAY CIRCUIT, CLOCK CONTROL CIRCUIT AND CONTROL METHOD

TECHNICAL FIELD

The present application relates to an integrated circuit, particularly to a delay circuit, a clock control circuit, and a control method.

BACKGROUND OF THE INVENTION

Delay elements are building blocks of clock distribution networks in some integrated circuits and systems. The delay elements are used to define a time reference for data movement within these systems. Variable delay elements are inverter-based circuits used for fine, precise and accurate control of pulse delay (or phase) in high-speed digital integrated circuits. In order to achieve a wide range of delay or phase adjustment, the delay elements are implemented as a chain of inverters, the chain of inverters also called as delay line. In many integrated circuits, delay lines are applied in many systems, such as DLL (Delayed Phase Locked Loop), TDC (Time-to-Digital Converter), VCO (Voltage Controlled Oscillator), PWCL (Pulse Width Control Loop), etc., for precise and accurate pulse time references.

There are following defects in circuit structure of existing delay lines: generating glitch when switching delay control signal; increasing duty cycle loss of output signal as the number of delay lines increases; increasing input load linearly as the number of delay line stages increases.

SUMMARY OF THE INVENTION

The application adopts a simple and easy delay unit, which eliminates the glitch when switching the control signal and the duty cycle loss.

In one embodiment, the present application provides a delay circuit comprising an N-stage delay units coupled in a chain, the delay unit of each stage comprises a four-state gate circuit and an inverter circuit, an input terminal of a four-state gate circuit and an input terminal of an inverter circuit of each stage are coupled together, another input terminal of the inverter circuit is coupled to an output terminal of the inverter circuit of the next stage; an input signal is coupled to the input terminal of the four-state gate circuit and the inverter circuit of the first stage, and is output with a certain delay of time by sequentially passing through the four-state gate circuit and the inverter circuit of each stage.

In another embodiment, the present application provides a clock control configured to comprise the delay circuit as described above, wherein a clock signal and a mask signal are coupled to an input terminal of the delay circuit through a logic gate; an output terminal of the delay circuit is coupled to a logic circuit module.

In another embodiment, the present application provides a clock control method comprising: controlling, in the 0th to M−1th stages, inverter units to be turned on, pull-up units and pull-down units to be turned off, and in the Mth-stage, an inverter unit to be turned off; controlling, in the 0th to M−1th stages, first inverters to be turned off and second inverters to be turned on, and in the Mth stage, a first inverter to be turned on and a second inverter to be turned off; and outputting, a clock signal by passing through the inverter units of the 0th to M−1th stages, the first inverter of the Mth stage and the second inverters of the M−1th to the 0th stages.

Compared with the prior art, the present application has at least the following beneficial effects:

1) The delay unit of each stage is identical, the duty cycle loss caused by process, voltage and temperature offset of the inverter circuit of each stage is completely compensated by the inverter circuit of the next stage, so that there is no duty cycle loss.

2) Voltages of internal nodes of the delay circuit are alternately distributed at a stable high and low level. Regardless of whether the control signal is switched to turn on or off any stage, the voltages of the internal nodes of the delay line is still alternately distributed at a stable high and low level, and no glitch signal is generated when switching the control signal.

BRIEF DESCRIPTION OF THE DRAWINGS

Embodiments of the present application are described with reference to the following figures. The figures used in the application are intended to describe embodiments and are not intended to be limiting, and the true scope of the present application is indicated by the claims.

FIG. 5 is a schematic diagram of a clock control circuit according to an embodiment of the application.

FIG. 6 is a schematic diagram of a clock control circuit according to another embodiment of the application.

FIG. 7 is a schematic flow chart of a clock control method according to an embodiment of the application.

DETAILED DESCRIPTION OF THE ILLUSTRATED EMBODIMENTS

Figure 1:
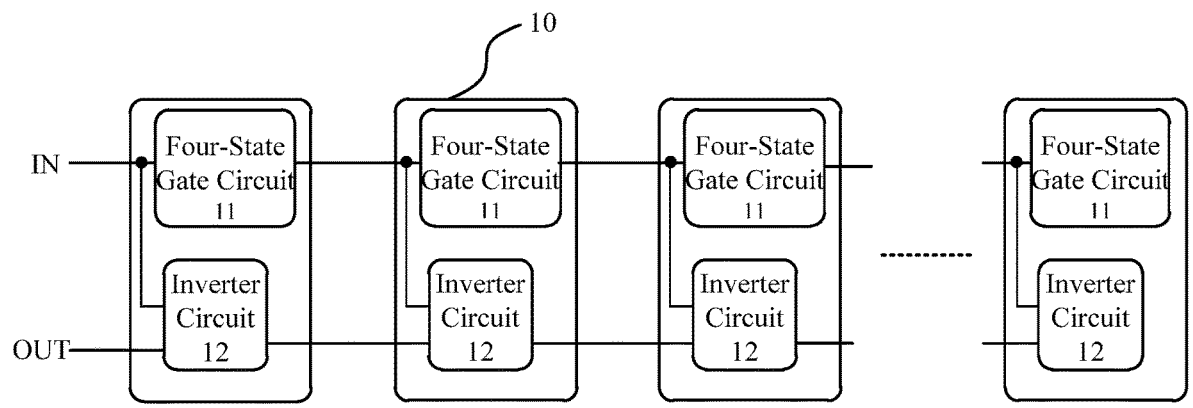
FIG. 1 is a schematic block diagram of a delay circuit according to an embodiment of the application.

FIG. 1 is a block diagram that illustrates a delay circuit according to an embodiment of the application. As shown in FIG. 1, the delay circuit includes N-stage delay units 10 coupled in a chain, the delay unit 10 of each stage includes a four-state gate circuit 11 and an inverter circuit 12, and an input terminal of the four-state gate circuit 11 and an input terminal of the inverter circuit 12 of the same stage are coupled together, another input terminal of the inverter circuit 12 is coupled to an output terminal of the inverter circuit 12 of the next stage. An input signal IN is coupled to the input terminals of the four-state gate circuit 11 and the inverter circuit 12 of the first stage, and passed through the four-state gate circuit 11 and the inverter circuit 12 of each stage to output an output signal OUT that is delayed for a certain time.

Figure 2:
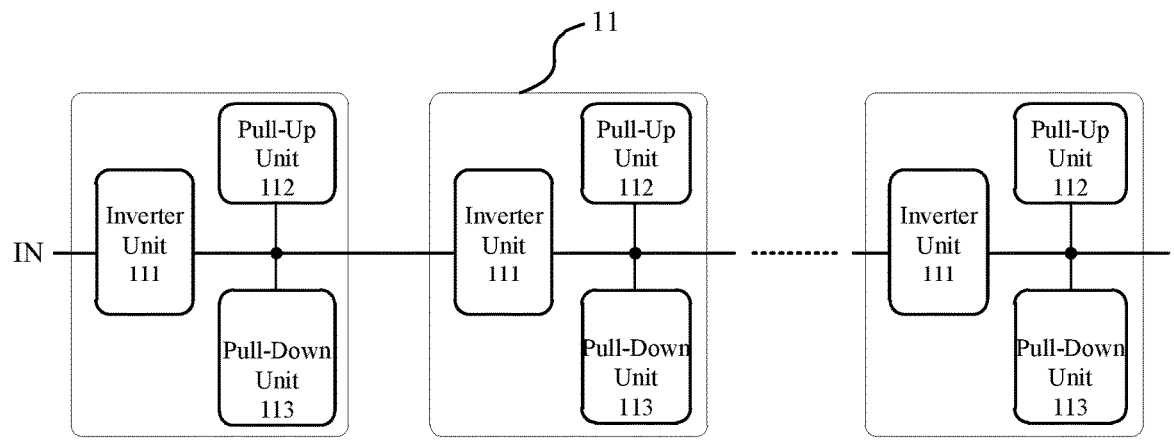
FIG. 2 is a schematic block diagram of a four-state gate according to an embodiment of the application.

FIG. 2 is a block diagram that illustrates a four-state gate according to an embodiment of the application. As shown in FIG. 2, the four-state gate circuit 11 includes an inverter unit 111, a pull-up unit 112 and a pull-down unit 113. The output terminals of the inverter unit 111, the pull-up unit 112 and the pull-down unit 113 are coupled together to an input terminal of the inverter unit 111 of the next stage.

Figure 3:
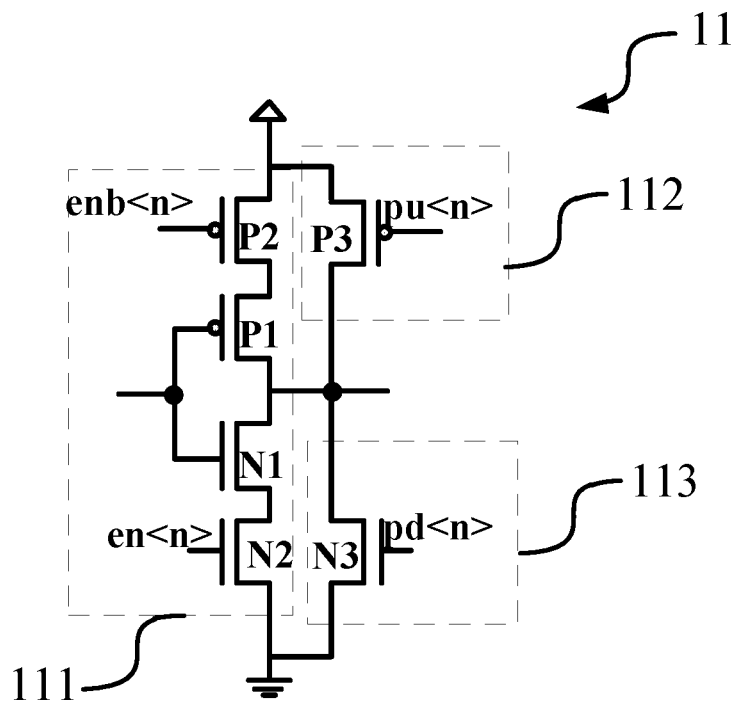
FIG. 3 is a schematic diagram of a four-state gate circuit according to an embodiment of the application.

As shown in FIG. 3, the inverter unit 111 includes a first PMOS transistor P1, a second PMOS transistor P2, a first NMOS transistor N1 and a second NMOS transistor N2.

A gate of the first PMOS transistor P1 and a gate of the first NMOS transistor N1 are coupled together, and coupled to an input terminal of the inverter unit 111 of the previous stage. A drain of the first PMOS transistor P1 and a drain of the first NMOS transistor N1 are coupled together, and coupled to the input terminal of the inverter unit 111 of the next stage.

A source of the first PMOS transistor P1 is coupled to a drain of the second PMOS transistor P2, a source of the second PMOS transistor P2 is coupled to a power supply, and a gate of the second PMOS transistor P2 is coupled to a first control command enb.

A source of the first NMOS transistor N1 is coupled to a drain of the second NMOS transistor N2, a source of the second NMOS transistor N2 is grounded, and a gate of the second NMOS transistor N2 is coupled to a second control command en, wherein the first control command enb and the second control command en are a pair of inverted control signals.

The pull-up unit 112 includes a third PMOS transistor P3, wherein a gate of the third PMOS transistor P3 is coupled to a third control command pu, a source of the third PMOS transistor P3 is coupled to the power supply, a drain of the third PMOS transistor P3 is coupled to the input terminal of the inverter unit 111 of the next stage. The output terminal of the four-state gate circuit 11 is pulled to a high level and stabilized at a high level when turning on the third PMOS transistor P3 according to the third control command pu.

The pull-down unit 113 includes a third NMOS transistor N3, wherein a gate of the third NMOS transistor N3 is coupled to a fourth control command pd, a source of the third NMOS transistor N3 is grounded, a drain of the third NMOS transistor N3 is coupled to the input terminal of the inverter unit 111 of the next stage. The output terminal of the four-state gate circuit 11 is pulled to a low level and stabilized at a low level when turning on the third NMOS transistor N3 according to the fourth control command pd.

The four-state gate circuit 11 has at least three operation modes: the input signal is inverted at output of the inverter unit 111 when turning on the inverter unit 111, turning off the pull-up unit 112 and the pull-down unit 113; the output signal is always at a high level when turning on the inverter unit 111 and the pull-up unit 112, and turning off the pull-down unit 113; the output signal is always at a low level when turning on the inverter unit 111 and the pull-down unit 113, and turning off the pull-up unit 112. In addition, the operation modes in the present application further include a high-resistance operation mode, wherein the four-state gate circuit is in a high-resistance state when the inverter unit 111, the pull-up unit 112 and the pull-down unit 113 of the four-state gate circuit 11 are all turned off.

Figure 4:
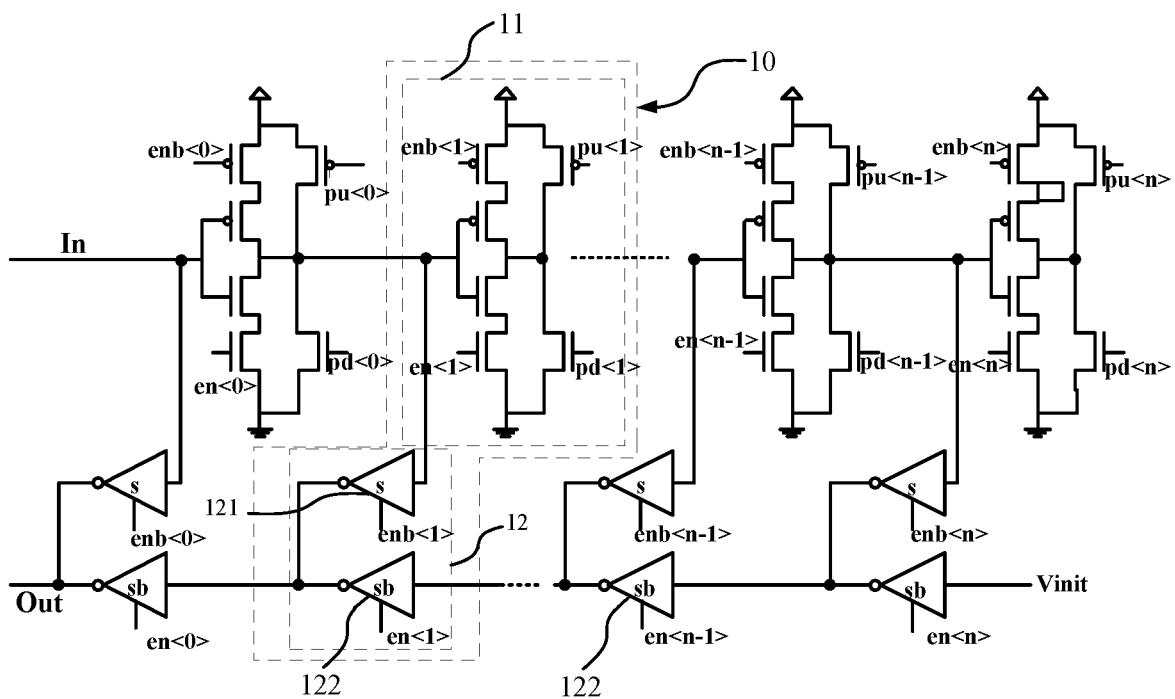
FIG. 4 is a schematic diagram of a delay unit according to an embodiment of the application.

FIG. 4 is a diagram that illustrates a delay unit according to an embodiment of the application. Referring to FIG. 4, the inverter circuit 12 includes a first inverter 121 and a second inverter 122. An output terminal of the first inverter 121 and an output terminal of the second inverter 122 are coupled together. An input terminal of the first inverter 121 is coupled to the input terminal of the inverter unit 111 of the same stage, and the output terminal of the second inverter 122 of the next stage is coupled to an input terminal of the second inverter 122 of the previous stage. The first inverter 121 is coupled to the first control command enb, and the second inverter 122 is coupled to the second control command en. The first inverter 121 and the second inverter 122 are respectively in an turn-on or turn-off state (that is, the first inverter 121 is turned on while the second inverter 122 is turned off, or the first inverter 121 is turned off while the second inverter 122 is turned on), so that the output signal of the four-state gate circuit 11 is selectivity output by the inverter circuit 12.

In another embodiment, referring to FIG. 5, the present application further provides a clock control circuit 20, the clock control circuit 20 includes the delay circuit 21 described above, and may further includes an AND logic gate 23, an inverter 24 and a logic circuit module. A clock signal clk_in is coupled to an input terminal of the AND logic gate 23, a mask signal gate_en is coupled to the other input terminal of the AND logic gate 23 through the inverter 24; an output terminal of the AND logic gate is coupled to an input terminal IN of the delay circuit, an output terminal OUT of the delay circuit 21 is coupled to the logic circuit module 22. The delay circuit 21 further includes an input signal Vinit and a control signal Code. As shown in FIG. 4, the input signal Vinit is coupled to the input terminal of the second inverter unit 122 of the nth stage. The control signal Code is configured to control the delay circuit 21 to output a locked time.

In another embodiment, referring to FIG. 6, the present application further provides a clock control circuit 30, the clock control circuit 30 includes the delay circuit 21 described in the above embodiment, and may further includes an OR logic gate 33, and a logic circuit module 32. A clock signal clk_in and a mask signal gate_en are respectively coupled to input terminals of the OR logic gate 33, and an output terminal of the OR logic gate 33 is coupled to the input terminal IN of the delay circuit 21. The output terminal OUT of the delay circuit 21 is coupled to the logic circuit module 32. The delay circuit 31 further includes an input signal Vinit and a control signal Code, and the input signal Vinit is coupled to an input terminal of the second inverter unit 122 of the nth stage. The control signal Code is configured to control the delay circuit 31 to output a locked time.

In another embodiment, as shown in FIG. 4 and FIG. 7, the present application further provides a clock control method, comprising:

In S110, in the 0th to M−1th stages, the inverter units 111 are turned on, the pull-up units 112 and the pull-down units 113 are turned off, while in the Mth stage, the inverter unit 111, the pull-up unit 112 and the pull-down unit 113 are turned off, the input signal is inverted by the four-state gate circuit 11;

In S120, in the 0th to M−1th stages, the first inverters 121 are turned off, the second inverters 122 are turned on, while in the Mth stage, the first inverter 121 is turned on, and the second inverter 122 is turned off, so that the input signal of the delay circuit is sequentially passing through the four-state gate circuits of the 0th to M−1th stages, the first inverter of the Mth stage and the second inverters 122 of the M−1th to 0th stages;

In S130, the mask signal gate_en is turned off, and the output clock signal is delayed for a certain time. Specifically, the mask signal gate_en is at a low level, and the clock signal clk_in is input to the input terminal IN of the delay circuit. The clock signal is output with a certain delay of time by sequentially passing through the inverter units 111 of the 0th to M−1th stages, the first inverter 121 of the Mth stage, and the second inverters 122 of the M−1th to 0th stages, and therefore a M-level delay of the clock signal is achieved.

In this embodiment, the delay unit of each stage is identical, the duty cycle loss caused by process, voltage, and temperature offset of the inverter circuit of each stage is completely compensated by the inverter circuit of the next stage, so that there is no duty cycle loss.

Figure 8:
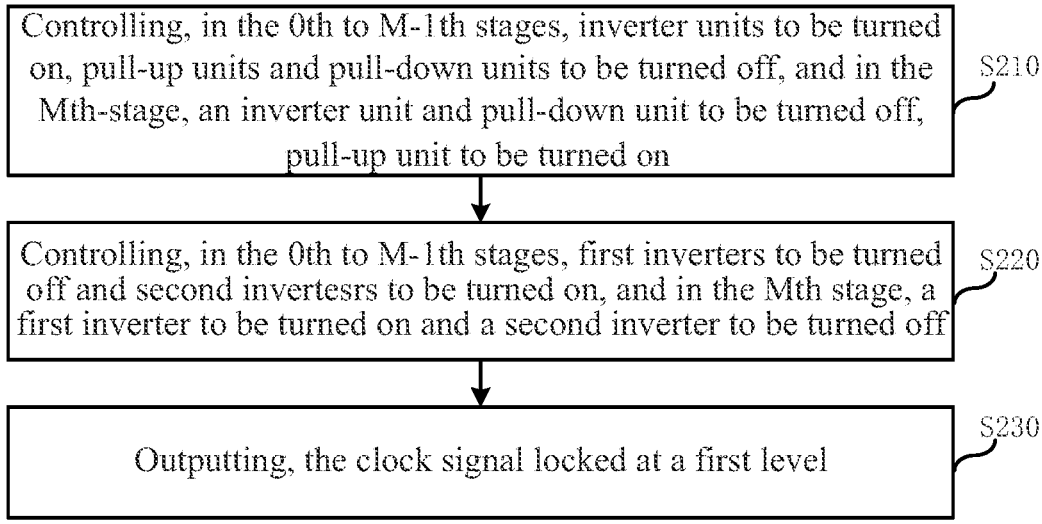
FIG. 8 is a schematic flow chart of a clock control method according to another embodiment of the application.

As shown in FIG. 4, FIG. 5, and FIG. 8, in another embodiment, the clock control method of the present application includes:

In S210, in the 0th to M−1th stages, the inverter units 111 are turned on, the pull-up units 112 and the pull-down units 113 are turned off, while in the Mth stage, the inverter unit 111 and the pull-down unit 113 are turned off, and the pull-up unit 112 is turned on. The output of the four-state gate circuit 11 of the Mth stage is pulled up to a high level, where M is a natural number between 0 and N;

In S220, in the 0th to M−1th stages, the first inverters 121 are turned off, the second inverters 122 are turned on, while in the Mth stage, the first inverter 121 is turned on, and the second inverter 122 is turned off;

In S230, the mask signal gate_en is turned on, and the output clock signal OUT is locked at a first level. The mask signal gate_en is at a high level, and by the inverter 24 and the AND logic gate 23, the input terminal IN of the delay circuit is kept constant at a low level and the output clock signal OUT is locked at a low level. In addition, in the embodiment, the output terminal of the delay circuit may be externally coupled to an inverter such that the output clock signal OUT is locked at a high level.

During the operation of the delay circuit, the four-state gate circuits 11 of the even-numbered stages that are turned off output logic high, and the four-state gate circuits 11 of the odd-numbered stages that are turned off output logic low. The voltages of internal nodes of the delay circuit are alternately distributed at a stable high and low (1/0) level. Regardless of whether the control signal is switched to turn on or off any stage, the voltages of internal nodes of the delay line are still alternately distributed at a stable high and low level, and no glitch signal is generated when switching the control signal.

Figure 9:
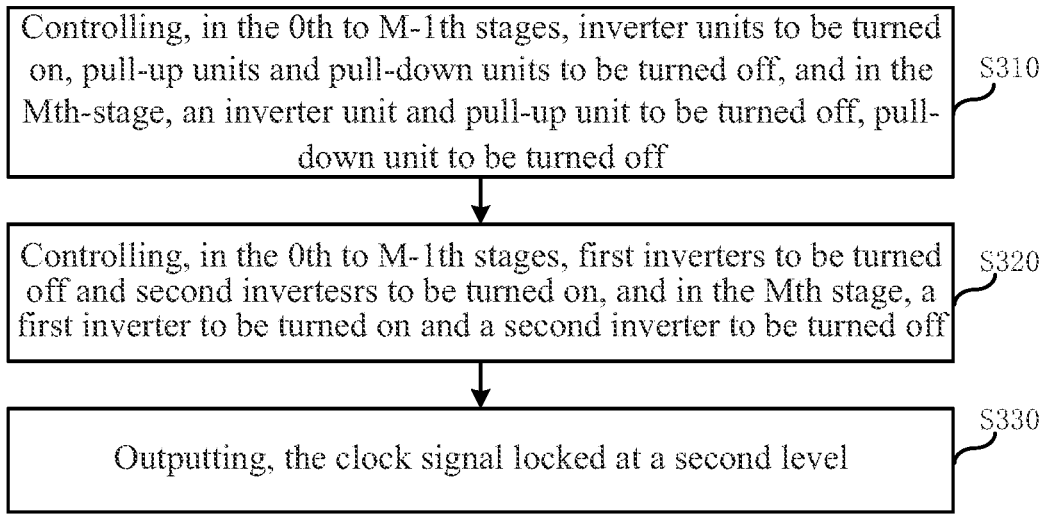
FIG. 9 is a schematic flow chart of a clock control method according to another embodiment of the application.

Referring to FIG. 4, FIG. 6, and FIG. 9, in another embodiment, the clock control method of the present application includes:

In S310, in the 0th to M−1th stages, the inverter units 111 are turned on, the pull-up units 112 and the pull-downs 113 unit are turn off, while in the Mth stage, the inverter unit 111 and the pull-up unit 121 are turned off, and the pull-down unit 113 is turned on. The output of the four-state gate circuit 11 of the Mth stage is pulled down to a low level and remains at a low level;

In S320, in the 0th to M−1th stages, the first inverters 121 are turned off, the second inverters 122 are turned on, while in the Mth stage, the first inverter 121 is turned on, and the second inverter 122 is turned off;

In S330, the mask signal gate_en is turned on, and the output clock signal OUT is locked at a second level. The mask signal gate_en is at a high level, and input terminal IN of the delay circuit is kept low and the clock signal output OUT is locked at a high level by the OR logic gate 33. In addition, in the embodiment, the output terminal of the delay circuit may be externally coupled to an inverter such that the clock signal output OUT is locked at a low level.

It should be noted that all or any of the embodiments described above may be combined with each other unless otherwise stated or such embodiments may be functionally and/or architecturally mutually exclusive.

While the present application has been described in connection with the specific exemplary embodiments of the invention, the invention is not limited to the embodiments described herein, but may be implemented in a modified or amended form within the spirit and scope of the appending claims. Accordingly, the description and drawings are to be regarded as illustrative and not restrictive.

From the above, it is to be noted that the specific embodiments of the present application are described herein for the purpose of illustration, but may be variously modified without departing from the scope of the application. Accordingly, the application is not limited except by the scope of the appended claims.

Other changes to the disclosed embodiments can be understood and implemented by those skilled in the art via the drawings, the disclosure and the claims. In the claims, the "comprising" or "includes" or "comprises" does not exclude other components or steps, and the indefinite article "a" or "an" does not exclude a plurality. Even though specific features are recited in different dependent claims, the present application is directed to embodiments having these features in common. Any reference signs in the claims should not be construed as limiting.

The features and aspects of the different embodiments may be integrated into other embodiments, and the embodiments shown in this specification can be implemented without all the features or aspects described. It will be appreciated by those skilled in the art that, although the specific examples and embodiments of the present systems and methods are described for illustrative purposes, various modifications may be made without departing from the spirit and scope of the application. Furthermore, the features of one embodiment may be included in another embodiment, even if such features are not described together in this specification in a single embodiment. Accordingly, the application is described by the appending claims.

What is claimed is:

1. A delay circuit, comprising:
N-stage delay units coupled in a chain, wherein:
the delay unit of each stage comprises a four-state gate circuit and an inverter circuit, an input terminal of the four-state gate circuit and an input terminal of the inverter circuit of each stage are coupled together, another input terminal of the inverter circuit is coupled to an output terminal of the inverter circuit of the next stage;
an input signal is coupled to the input terminal of the four-state gate circuit and the inverter circuit of the first stage, and is output with a certain delay of time by sequentially passing through the four-state gate circuit and the inverter circuit of each stage;
the four-state gate circuit comprises an inverter unit, a pull-up unit and a pull-down unit, wherein output terminals of the inverter unit, the pull-up unit and the pull-down unit are coupled together to an input terminal of the inverter unit of the next stage; and
the four-state gate circuit comprises inverter mode, high-level output mode, low-level output mode, and high-resistance mode.

2. The delay circuit of claim 1, wherein
the inverter unit comprises a first PMOS transistor, a second PMOS transistor, a first NMOS transistor and a second NMOS transistor;
a gate of the first PMOS transistor and a gate of the first NMOS transistor are coupled to the input terminal of the inverter unit of the previous stage, and a drain of the first PMOS transistor and a drain of the first NMOS transistor are coupled to the input terminal of the inverter unit of the next stage;
a source of the first PMOS transistor is coupled to a drain of the second PMOS transistor, a source of the second PMOS transistor is coupled to a power supply, and a gate of the second PMOS transistor is coupled to a first control command; and a source of the first NMOS transistor is coupled to a drain of the second NMOS transistor, a source of the second NMOS transistor is grounded, and a gate of the second NMOS transistor is coupled to a second control command.

3. The delay circuit of claim 1, wherein the pull-up unit comprises a third PMOS transistor, a gate of the third PMOS transistor is coupled to a third control command, a source of the third PMOS transistor is coupled to a power supply, and a drain of the third PMOS transistor is coupled to the input terminal of the inverter unit of the next stage.

4. The delay circuit of claim 1, wherein the pull-down unit comprises a third NMOS transistor, a gate of the third NMOS transistor is coupled to a fourth control command, a source of the third NMOS transistor is grounded, and a drain of the third NMOS transistor is coupled to the input terminal of the inverter unit of the next stage.

5. The delay circuit of claim 1, wherein the inverter circuit comprises a first inverter and a second inverter, output terminals of the first inverter and the second inverter are coupled together, an input terminal of the first inverter is coupled to an input terminal of the four-state gate circuit of the respective stage, and an input terminal of the second inverter is coupled to an output terminal of the second inverter of the next stage; the first inverter is coupled to a first control command, the second inverter is coupled to a second control command.

6. A clock control circuit, configured to comprise the delay circuit of claim 1, wherein a clock signal and a mask signal are coupled to an input terminal of the delay circuit through a logic gate, and an output terminal of the delay circuit is coupled to a logic circuit module.

7. The clock control circuit of claim 6, wherein the clock signal is coupled to an input terminal of an AND logic gate, the mask signal is coupled to the other input terminal of the AND logic gate through an inverter, and an output terminal of the AND logic gate is coupled to an input terminal of the delay circuit.

8. The clock control circuit of claim 6, wherein the clock signal and the mask signal are respectively coupled to two input terminals of a OR logic gate, and an output terminal of the OR logic gate is coupled to an input terminal of the delay circuit.

9. A clock control method for a clock control circuit of claim 6, comprising:

controlling, in the 0th to M−1th stages, inverter units to be turned on, pull-up units and pull-down units to be turned off, and in the Mth-stage, an inverter unit to be turned off;

controlling, in the 0th to M−1th stages, first inverters to be turned off and second inverters to be turned on, and in the Mth stage, a first inverter to be turned on and a second inverter to be turned off; and outputting, a clock signal by passing through the inverter units of the 0th to M−1th stages, the first inverter of the Mth stage and the second inverters of the M−1th to the 0th stages.

10. The clock control method of claim 9, wherein the clock signal is output with a certain delay of time when the mask signal is turned off and the pull-up unit and the pull-down unit of the Mth stage are turned off.

11. The clock control method of claim 9, wherein the output clock signal is locked at a first level when the mask signal is turned on, and the pull-up unit of the Mth stage is turned on, and the pull-down unit of the Mth stage is turned off.

12. The clock control method of claim 9, wherein the output clock signal is locked at a second level when the mask signal is turned on, and the pull-up unit of the Mth stage is turned off, the pull-down unit of the Mth stage is turned on.

* * * * *